(12) United States Patent
Shafer

(10) Patent No.: US 6,873,476 B2
(45) Date of Patent: Mar. 29, 2005

(54) MICROLITHOGRAPHIC REDUCTION PROJECTION CATADIOPTRIC OBJECTIVE

(75) Inventor: David R. Shafer, Fairfield, CT (US)

(73) Assignee: Carl-Zeiss-Stiftung, Heidenheim (DE)

( * ) Notice: Subject to any disclaimer, the term of this patent is extended or adjusted under 35 U.S.C. 154(b) by 217 days.

(21) Appl. No.: 09/759,806

(22) Filed: Jan. 12, 2001

(65) Prior Publication Data

US 2002/0012100 A1 Jan. 31, 2002

Related U.S. Application Data

(60) Provisional application No. 60/176,190, filed on Jan. 14, 2000.

(51) Int. Cl.[7] .............................................. G02B 17/08
(52) U.S. Cl. ..................................................... 359/731
(58) Field of Search ................................ 359/726–736, 359/649–651

(56) References Cited

U.S. PATENT DOCUMENTS

| | | | |
|---|---|---|---|
| 4,171,871 A | 10/1979 | Dill et al. | 350/199 |
| 4,232,969 A | 11/1980 | Wilczynski | 356/401 |
| 4,595,295 A | 6/1986 | Wilczynski | 356/401 |
| 4,685,777 A | 8/1987 | Hirose | |

(Continued)

FOREIGN PATENT DOCUMENTS

| | | | |
|---|---|---|---|
| DE | 197 26 058 | 1/1998 | |
| DE | 196 39 586 | 4/1998 | |
| EP | 0 604 093 | 6/1994 | ........... G02B/17/08 |
| EP | 0 779 528 A2 | 6/1997 | ........... G02B/17/08 |
| EP | 0 816892 | 1/1998 | ........... G02B/17/08 |
| EP | 0 869 383 A2 | 10/1998 | ........... G02B/17/08 |
| EP | 1 069 448 A1 | 1/2001 | ........... G02B/17/08 |
| EP | 1 336 887 | 8/2003 | |
| WO | WO 94/06047 | 3/1994 | |

OTHER PUBLICATIONS

Morgan, Joseph, Introduction to Geometrical and Physical Optics, McGraw–Hill, 1953, p. 2.*
Smith, Warren J. Modern Optical Engineering: the Design of Optical Systems, 3rd Ed, McGraw–Hill, 2000, p. 98.*
U.S. Appl. No. 09/761,562, filed Jan. 16, 2001, Shafer et al.

*Primary Examiner*—Scott J. Sugarman
*Assistant Examiner*—Deborah A. Raizen
(74) *Attorney, Agent, or Firm*—Darby & Darby

(57) ABSTRACT

The invention concerns a microlithographic reduction projection catadioptric objective having an even number greater than two of curved mirrors, being devoid of planar folding mirrors and featuring an unobscured aperture. The objective has a plurality of optical elements, and no more than two optical elements deviate substantially from disk form. The objective has an object side and an image side, and has in sequence from the object side to the image side a catadioptric group providing a real intermediate image, a catoptric or catadioptric group providing a virtual image, and a dioptric group providing a real image.

38 Claims, 3 Drawing Sheets

U.S. PATENT DOCUMENTS

| | | | | |
|---|---|---|---|---|
| 4,701,035 A | | 10/1987 | Hirose | |
| 4,757,354 A | * | 7/1988 | Sato et al. | 355/53 |
| 5,052,763 A | | 10/1991 | Singh et al. | |
| 5,063,586 A | | 11/1991 | Jewell et al. | 378/34 |
| 5,071,240 A | | 12/1991 | Ichihara et al. | 359/366 |
| 5,078,502 A | | 1/1992 | Cook | 359/366 |
| 5,089,913 A | | 2/1992 | Singh et al. | 359/727 |
| 5,153,898 A | | 10/1992 | Suzuki et al. | 378/34 |
| 5,159,172 A | | 10/1992 | Goodman et al. | 219/151.68 |
| 5,212,588 A | | 5/1993 | Viswanathan et al. | 359/355 |
| 5,220,590 A | | 6/1993 | Bruning et al. | 378/34 |
| 5,241,423 A | | 8/1993 | Chiu et al. | 359/355 |
| 5,315,629 A | | 5/1994 | Jewell et al. | 378/34 |
| 5,323,263 A | | 6/1994 | Schoenmakers | |
| 5,353,322 A | | 10/1994 | Bruning et al. | 378/34 |
| 5,401,934 A | | 3/1995 | Ainsworth, Jr. et al. | 219/121.18 |
| 5,410,434 A | | 4/1995 | Shafer | 359/858 |
| 5,515,207 A | | 5/1996 | Foo | 359/731 |
| 5,537,260 A | | 7/1996 | Williamson | 359/727 |
| 5,592,329 A | * | 1/1997 | Ishiyama et al. | 359/399 |
| 5,608,526 A | | 3/1997 | Piwonka-Corle et al. | 356/369 |
| 5,650,877 A | * | 7/1997 | Phillips et al. | 359/726 |
| 5,652,679 A | | 7/1997 | Freeman | |
| 5,686,728 A | | 11/1997 | Shafer | 250/492.2 |
| 5,742,436 A | | 4/1998 | Furter | 359/727 |
| 5,805,357 A | | 9/1998 | Omura | 359/727 |
| 5,805,365 A | | 9/1998 | Sweatt | 359/858 |
| 5,815,310 A | | 9/1998 | Williamson | 359/365 |
| 5,835,275 A | * | 11/1998 | Takahashi et al. | 359/629 |
| 5,956,192 A | | 9/1999 | Williamson | 359/859 |
| 6,008,885 A | * | 12/1999 | Takahashi et al. | 355/53 |
| 6,014,252 A | | 1/2000 | Shafer | 359/355 |
| 6,033,079 A | | 3/2000 | Hudyma | 359/857 |
| 6,142,641 A | | 11/2000 | Cohen et al. | 359/859 |
| 6,169,627 B1 | | 1/2001 | Schuster | 359/364 |
| 6,636,350 B2 | * | 10/2003 | Shafer et al. | 359/366 |

* cited by examiner

MICROLITHOGRAPHIC REDUCTION PROJECTION CATADIOPTRIC OBJECTIVE

CROSS-REFERENCE TO RELATED APPLICATIONS

The present application claims the benefit of U.S. patent application Ser. No. 60/176,190, filed Jan. 14, 2000.

REFERENCE TO A MICROFICHE APPENDIX

Not applicable.

BACKGROUND OF THE INVENTION

1. Technical Field

The invention concerns a microlithographic reduction projection catadioptric objective comprising an even number greater than two of curved mirrors, being devoid of planar folding mirrors and featuring an unobscured aperture.

2. Background Art

Such objectives are known from European Patent document EP 0 779 528 A (FIG. 3) as variants of pure catoptric objectives, with six mirrors and three lenses. All optical surfaces are symmetric to a common axis and an object plane and an image plane are situated on this axis upstream and downstream of the objective. However, all but one of the mirrors need to be cut off sections of bodies of revolution, so that mounting and adjustment face difficulties. The lenses serve only as correcting elements of minor effect. The most image ward mirror is concave.

U.S. Pat. No. 4,701,035 (FIG. 12) shows a similar objective. This one, however, has nine mirrors, two lenses and two intermediate images. The object plane and image plane are situated within the envelope of the objective.

In both cases the image field is an off-axis ring sector.

A fully axially symmetric catadioptric objective is known from German Patent document DE 196 39 586 A (corresponding to U.S. patent application Ser. No. 09/263, 788), e.g., with two opposing concave mirrors, an image field centered at the axis, and a central obscuration of the aperture.

Another type of catadioptric objective suitable for microlithographic reduction projection has only one concave mirror, but at least one folding mirror, and is known from U.S. Pat. No. 5,052,763 and European Patent document EP 0 869 383A inter alia and is referenced here as "h-design".

U.S. Pat. No. 5,323,263 discloses a microlithographic reduction projection catadioptric objective with multiple folding mirrors, where an intermediate image is arranged subsequent to a first concave mirror and a singly passed lens group.

U.S. Pat. Nos. 5,575,207 and 4,685,777 show very similar multiply folded catadioptric objectives.

SUMMARY OF THE INVENTION

It is an object of the invention to provide a generic objective of good capabilities of chromatic correction for typical bandwidths of excimer laser light sources, which allows for a high imageside numerical aperture, and which reduces complexity of mounting and adjusting.

The solution to this problem is found in the present invention.

BRIEF DESCRIPTION OF THE DRAWINGS

The invention is described in detail with respect to the drawings, wherein.

DETAILED DESCRIPTION OF PREFERRED EMBODIMENTS

An important concept of the present invention is to replace the front end of an "h-design" objective with a different front end that provides a single axis system.

Figure 1:
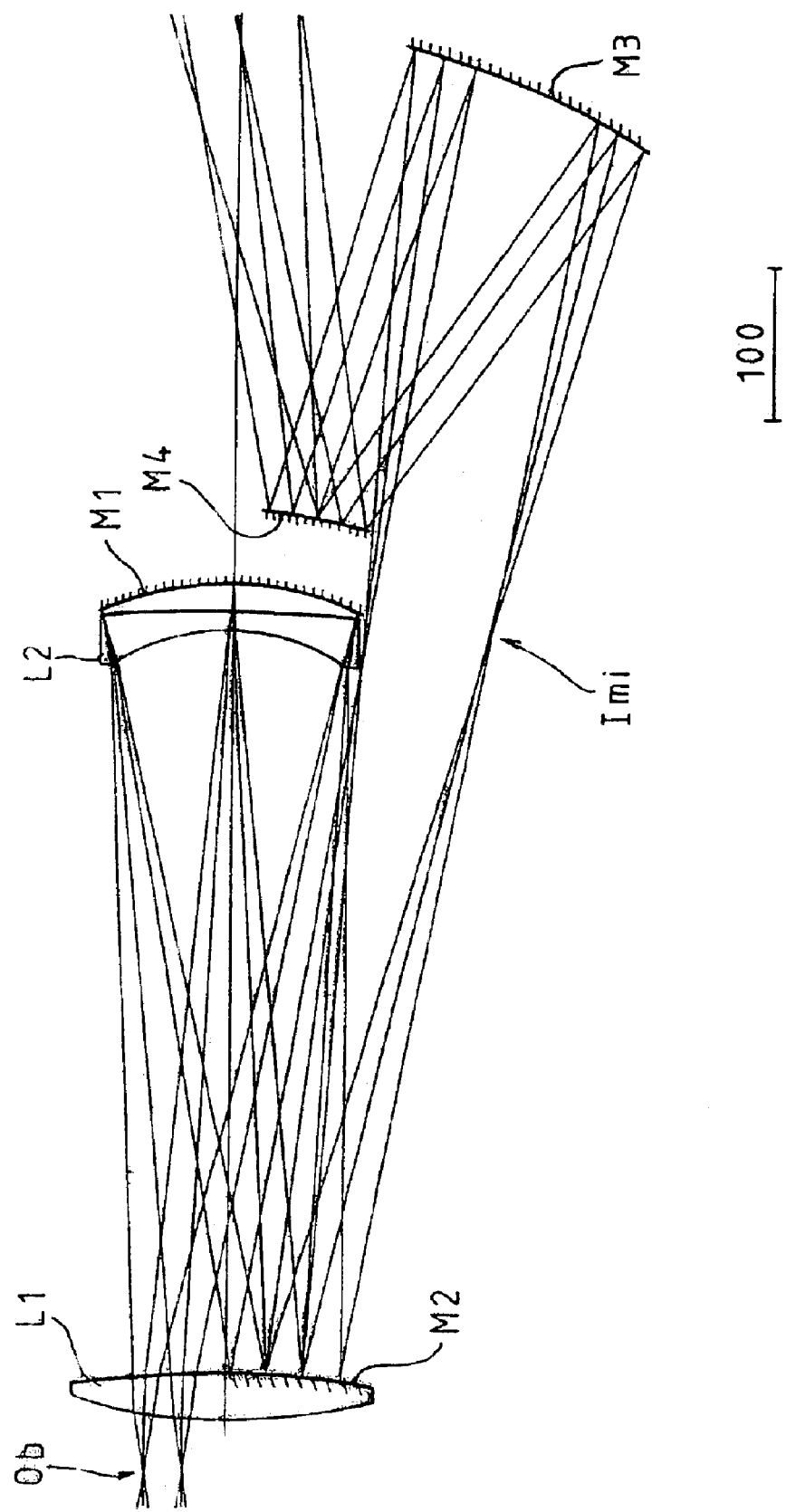
FIG. 1 shows a front end of an objective.

In the simplest version of this new front end, set up to be part of a −0.25 reduction, 0.75 image side NA system with a 7 mm ×26 mm rectangular image field size, the optical elements are shown in the lens section of FIG. 1. This catadioptric partial system provides a virtual image on the right hand side, which has enough a axial chromatic aberration to compensate for a conventional focusing lens group that forms a 0.75 NA image. A real pupil or aperture plane is formed on the right hand end of the system. The system shown has enough Petzval sum so that the focusing lens group can be made up mostly of positive power lenses.

There is only one field lens L1 in this system, which is close to the object plane (Ob) end of the system. That location is an advantage with respect to lens heating. There are no aspherics in this front end, and none are needed. The mirrors M1 to M4 are all spherical and coaxial to the common optical axis. It is possible to correct this front end system for spherical aberration of the pupil, but that requires a somewhat larger concave mirror than shown here. Spherical aberration can as well be corrected in the focusing lens group and therefore the size of the concave mirror M3 is minimized. Decreased size of mirror M3 simplifies the mechanical construction of the system. In the example of FIG. 1, the concave mirror M3 has an illuminated area that is about 165 mm wide in the plane of the drawing and about 500 mm in the orthogonal direction, for a 7 mm×26 mm image field size.

The greatest distance of any ray from the common optical axis is 370 mm in this example. This is substantially less than for many designs of the "h-design" type, where the concave mirror thickness and mount thickness must be added in to the sideways ray path distance after the fold mirror, from the axis to the concave mirror. The package envelope of this new design is more attractive.

More axial chromatic aberration and Petzval curvature can be introduced by the front end (FE) than in the example of FIG. 1, by increasing the power of the negative lens L2 near the concave mirror M1. A strong lens L2 however, tends to introduce too much overcorrected spherical aberration and makes the intermediate image aberrations too large. Thus, a better version of the design has two concave lenses near the concave mirror.

The field lens L1 near the object plane Ob can also be split into two weaker lenses, to help control pupil aberration. Finally, the convex mirror M2 that is near the reticle (Ob) can be split off from the field lens L1 surface and made to be a separate optical element. This more complicated design is capable of better performance.

Figure 2:
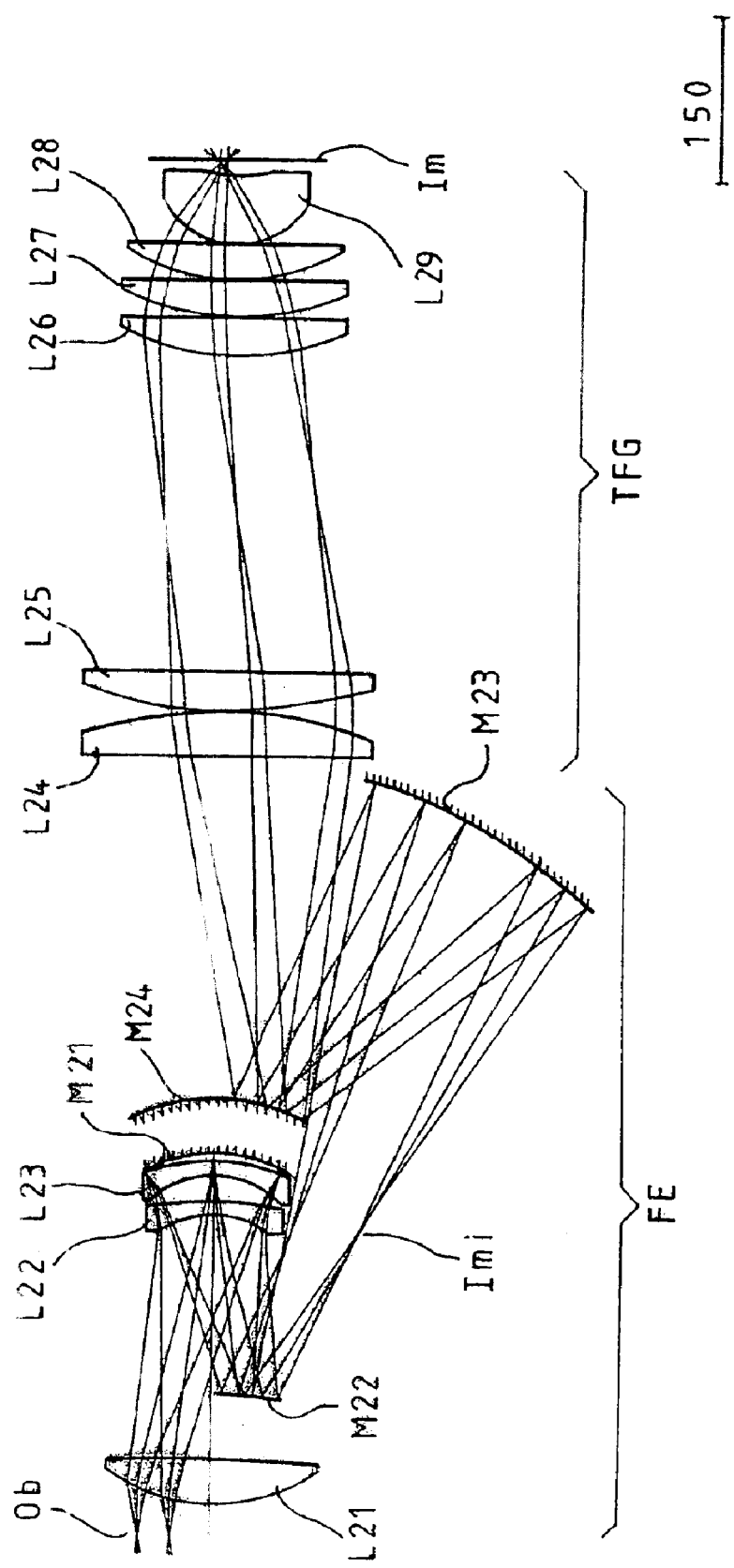
FIG. 2 shows the lens plan of a version of the objective.

It is possible to make this system meet all of the first-order specifications of a typical microlithographic objective as well as correct for Petzval curvature, and axial and lateral color correction, with only positive lenses in the telecentric focusing group (TFG). An example is shown in FIG. 2, without any other kind of aberration correction. The lens heating is substantially uniform, as the beam diameter is large on all the lenses L21 to L29.

Figure 3:
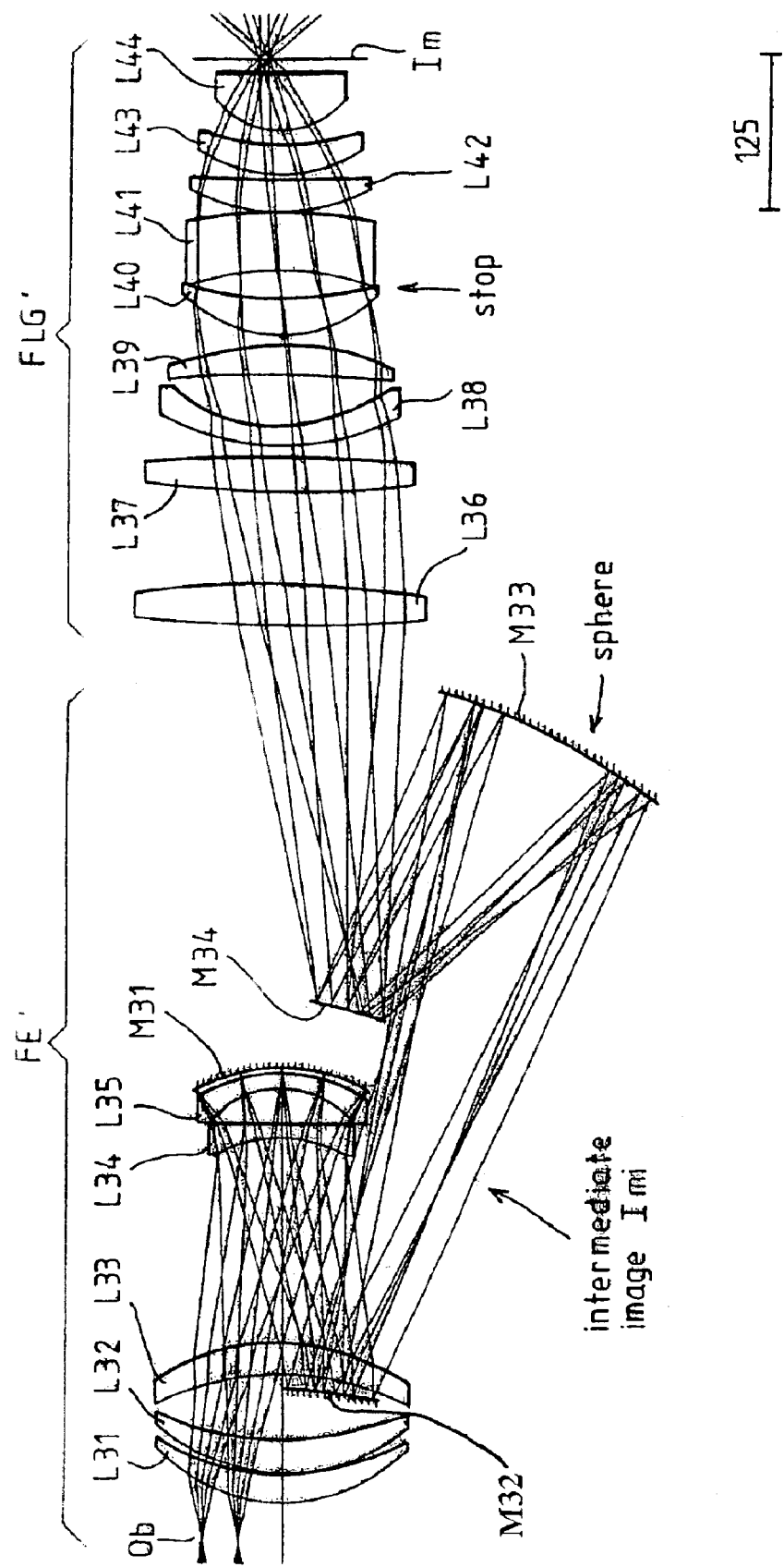
FIG. 3 shows the lens plan of another version of the objective.

FIG. 3 shows a further embodiment example. The front end FE' features a field lens group split into 3 lenses L31 to L33, which helps achieve a good quality telecentricity. Also, the focussing lens group (FLG') now has more lenses L36 to L44. This focussing lens group FLG' has a few aspherics. There are also some aspherics in the catadioptric front end FE' of the design that simplify correction, though they are not compulsory. The large mirror M33 is still a sphere, as this simplifies production.

Preferred locations of the aspheric surface are near an aperture or pupil plane, namely on mirror M31 or on lenses L34, L35, where the marginal ray height exceeds 80% of the height of the neighboring aperture, and on the other hand on some distant locations with marginal ray height less than 80% of the height of the next aperture. Examples of the latter are surfaces of the field lens group or of the last two lenses next to the image plane Im.

The polychromatic r.m.s. wavefront error value in this design now varies from 0.05 to 0.13 waves over a 26×7 mm field at 0.75 NA in a 4× design.

The catadioptric front end FE' is now somewhat more complicated than in FIGS. 1 and 2. The design is both side telecentric and corrected for pupil aberration and distortion. The working distance is 34 mm on the reticle end (Ob) and 12 mm on the wafer end (Im). The system length is about 1200 mm.

The focusing lens group FLG' is almost all positive lenses (except L41), with no strong curves. The very large amount of aberration at the intermediate image is because the two concave lenses L31, L35 next to the concave mirror M31 do not have the optimum bending under this aspect.

Table I provides lens data for this embodiment.

Mechanical construction of the lens barrel for this type of objective is very advantageous when compared with catadioptric systems with folding of the optical axis (as "h-design" etc.). Here, only the mirrors M32 and M33 cannot be full disks. Mirror M33, however, can be extended to a full annular body that can be mounted in a rotationally symmetric structure. The barrel must be cut between the lenses L33 and L36 at a lower side of the drawing of FIG. 3 to provide passage to the light beam, but generally can be cylindrical. Only mirror M33 must be positioned outside this cylindrical barrel, but at a very moderate distance.

With "h-designs", a similar effect needs additional folding. Folding mirrors are generally not desirable, as they cause intensity losses and quality degradation of the light beam, and production costs and adjustment work without benefit to image quality.

It is possible to produce mirror M33 as an annular blank, and it can be mounted as this annular part in a cylindrical barrel that is extended in diameter in this area.

It can be seen that concave spherical mirror M33 is the only mirror extending outside of a cylindrical envelope scribed around all the lenses that has the radius of the lens of greatest radius. This shows again that this type of objective is suitable for mounting in a compact cylindrical barrel of high intrinsic rigidity.

The lens material in the given examples is calcium fluoride, fluorspar. Other materials standing alone or in combinations, may be used, namely at other wavelengths of excimer lasers. Quartz glass, eventually suitably doped, and fluoride crystals are such suitable materials.

Four, six and eight or more mirror objective designs known in the field of EUV lithography are generally suitable as starting designs for the front end group of the invention, with the eventual deviation that a virtual image instead of a real image is provided.

These embodiments are not intended to limit the scope of the invention. For example, in addition to curved mirrors, planar folding mirrors may occasionally be introduced into the system according to the invention.

All the features of the different claims can be combined in various combinations according to the invention.

TABLE 1

CODE V> lis
Shafer - design .75NA, 4x, 75 mm Obj. - hight

| | RDY | THI | RMD | GLA | CCY | THC | GLC |
|---|---|---|---|---|---|---|---|
| > OBJ: | INFINITY | 34.000000 | | | 100 | 100 | |
| 1: | 147.23281 | 21.000000 | | 'CAF-UV' | 100 | 100 | |
| 2: | 236.79522 | 1.000000 | | | 100 | 100 | |
| ASP : | | | | | | | |
| K : 0.000000 | | KC : 100 | | | | | |
| IC : YES | | CUF : 0.000000 | | CCF : 100 | | | |
| A : 0.273300E−07 | | B : 0.201130E−11 | | C : −.871260E−16 | D : 0.118100E−19 | | |
| AC : 100 | | BC : 100 | | CC : 100 | DC : 100 | | |
| 3: | 145.44401 | 27.000000 | | 'CAF-UV' | 100 | 100 | |
| 4: | 224.64885 | 51.185724 | | | 100 | 100 | |
| 5: | −223.00016 | 25.004072 | | 'CAF-UV' | 100 | 100 | |
| 6: | −184.59445 | 162.666291 | | | 100 | 100 | |
| 7: | −97.23630 | 12.000000 | | 'CAF-UV' | 100 | 100 | |
| 8: | −928.69926 | 24.980383 | | | 100 | 100 | |
| 9: | −75.28503 | 15.000000 | | 'CAF-UV' | 100 | 100 | |
| 10: | −116.14787 | 3.000000 | | | 100 | 100 | |
| 11: | −134.28262 | −3.000000 | REFL | | 100 | 100 | |
| ASP : | | | | | | | |
| K : 0.000000 | | KC : 100 | | | | | |
| IC : YES | | CUF : 0.000000 | | CCF : 100 | | | |
| A : 0.474810E−08 | | B : 0.506570E−12 | | C : −.284590E−17 | D : 0.934830E−21 | | |
| AC : 100 | | BC : 100 | | CC : 100 | DC : 100 | | |
| 12: | −116.14787 | −15.000000 | | 'CAF-UV' | 100 | 100 | |
| 13: | −75.28503 | −24.980383 | | | 100 | 100 | |
| 14: | −928.69926 | −12.000000 | | 'CAF-UV' | 100 | 100 | |
| 15: | −97.23630 | −162.666291 | | | 100 | 100 | |

TABLE 1-continued

CODE V> lis
Shafer - design .75NA, 4x, 75 mm Obj. - hight

| | RDY | THI | RMD | GLA | CCY | THC | GLC |
|---|---|---|---|---|---|---|---|
| 16: | −184.59445 | −25.004072 | | 'CAF-UV' | 100 | 100 | |
| 17: | −223.00016 | −11.195502 | | | 100 | 100 | |
| 18: | −363.91714 | 11.195502 | REFL | | 100 | 100 | |
| ASP : | | | | | | | |
| K : 0.000000 | KC : 100 | | | | | | |
| IC : YES | CUF : 0.000000 | CCF : 100 | | | | | |
| A : −.107960E−07 | B : 0.170830E−13 | C : −.328180E−16 | D : 0.143630E−20 | | | | |
| AC : 100 | BC : 100 | CC : 100 | DC : 100 | | | | |
| 19: | −223.00016 | 25.004072 | | 'CAF-UV' | 100 | 100 | |
| 20: | −184.59445 | 162.666291 | | | 100 | 100 | |
| 21: | −96.00000 | 15.000000 | | | 100 | 100 | |
| ASP : | | | | | | | |
| K : −1.000000 | KC : 100 | | | | | | |
| IC : YES | CUF : 0.000000 | CCF : 100 | | | | | |
| A : 0.000000E+00 | B : 0.000000E+00 | C : 0.000000E+00 | D : 0.000000E+00 | | | | |
| AC : 100 | BC : 100 | CC : 100 | DC : 100 | | | | |
| 22: | INFINITY | 24.980383 | | | 100 | 100 | |
| 23: | −247.00000 | 67.808099 | | | 100 | 100 | |
| ASP : | | | | | | | |
| K : −1.000000 | KC : 100 | | | | | | |
| IC : YES | CUF : 0.000000 | CCF : 100 | | | | | |
| A : 0.000000E+00 | B : 0.000000E+00 | C : 0.000000E+00 | D : 0.000000E+00 | | | | |
| AC : 100 | BC : 100 | CC : 100 | DC : 100 | | | | |
| 24: | −237.00000 | 266.861281 | | | 100 | 100 | |
| ASP : | | | | | | | |
| K : −1.000000 | KC : 100 | | | | | | |
| IC : YES | CUF : 0.000000 | CCF : 100 | | | | | |
| A : 0.000000E+00 | B : 0.000000E+00 | C : 0.000000E+00 | D : 0.000000E+00 | | | | |
| AC : 100 | BC : 100 | CC : 100 | DC : 100 | | | | |
| 25: | −470.62323 | −266.861281 | REFL | | 100 | 100 | |
| 26: | −210.84570 | 266.861281 | REFL | | 100 | 100 | |
| ASP : | | | | | | | |
| K : 0.000000 | KC : 100 | | | | | | |
| IC : YES | CUF : 0.000000 | CCF : 100 | | | | | |
| A : −.419940E−08 | B : −.904030E−13 | C : −.297400E−17 | D : −.10634.0E−21 | | | | |
| AC : 100 | BC : 100 | CC : 100 | DC : 100 | | | | |
| 27: | INFINITY | 35.031723 | | | 100 | 100 | |
| 28: | 1621.80000 | 33.000000 | | 'CAF-UV' | 100 | 100 | |
| ASP : | | | | | | | |
| K : 0.000000 | KC : 100 | | | | | | |
| IC : YES | CUF : 0.000000 | CCF : 100 | | | | | |
| A : 0.155580E−07 | B : −.854090E−12 | C : 0.123240E−16 | D : −.559700E−21 | | | | |
| AC : 100 | BC : 100 | CC : 100 | DC : 100 | | | | |
| 29: | −747.60113 | 67.859320 | | | 100 | 100 | |
| 30: | 827.21786 | 27.000000 | | 'CAF-UV' | 100 | 100 | |
| 31: | −1939.50000 | 20.227637 | | | 100 | 100 | |
| 32: | 197.25357 | 14.999969 | | 'CAF-UV' | 100 | 100 | |
| 33: | 128.31113 | 39.542169 | | | 100 | 100 | |
| 34: | −1370.10000 | 24.000000 | | 'CAF-UV' | 100 | 100 | |
| ASP : | | | | | | | |
| K : 0.000000 | KC : 100 | | | | | | |
| IC : YES | CUF : 0.000000 | CCF : 100 | | | | | |
| A : −.164770E−07 | B : 0.155510E−11 | C : −.542070E−16 | D : 0.556740E−20 | | | | |
| AC : 100 | BC : 100 | CC : 100 | DC : 100 | | | | |
| 35: | −253.41246 | 18.476467 | | | 100 | 100 | |
| 36: | 109.90063 | 30.001392 | | 'CAF-UV' | 100 | 100 | |
| ST0: | 242.23740 | 22.529315 | | | 100 | 100 | |
| 38: | −264.99438 | 46.219742 | | 'CAF-UV' | 100 | 100 | |
| 39: | −372.29467 | 0.998929 | | | 100 | 100 | |
| 40: | 173.30822 | 24.000000 | | 'CAF-UV' | 100 | 100 | |
| ASP : | | | | | | | |
| K : 0.000000 | KC : 100 | | | | | | |
| IC : YES | CUF : 0.000000 | CCF : 100 | | | | | |
| A : 0.628520E−07 | B : −.915530E−11 | C : −.628040E−15 | D : −.946620E−19 | | | | |
| AC : 100 | BC : 100 | CC : 100 | DC : 100 | | | | |
| 41: | 1411.60000 | 4.845900 | | | 100 | 100 | |
| 42: | 110.28842 | 22.740804 | | 'CAF-UV' | 100 | 100 | |
| 43: | 160.79657 | 13.371732 | | | 100 | 100 | |
| 44: | 69.10873 | 45.185600 | | 'CAF-UV' | 100 | 100 | |
| 45: | −895.78799 | 11.999039 | | | 100 | 100 | |
| ASP : | | | | | | | |
| K : 0.000000 | KC : 100 | | | | | | |
| IC : YES | CUF : 0.000000 | | | | | | |

TABLE 1-continued

CODE V> lis
Shafer - design .75NA, 4x, 75 mm Obj. - hight

| | RDY | THI | RMD | GLA | CCY | THC | GLC |
|---|---|---|---|---|---|---|---|
| A : −.113590E−06 | | B : 0.281520E−09 | | C : −.171880E−12 | D : 0.507740E−16 | | |
| AC : 100 | | BC : 100 | | CC : 100 | DC : 100 | | |
| IMG: | INFINITY | 0.000000 | | | | 100 | 100 |

SPECIFICATION DATA

| | | | | | |
|---|---|---|---|---|---|
| NAO | −0.18750 | | | | |
| TEL | | | | | |
| DIM | MM | | | | |
| WL | 157.63 | 157.63 | 157.63 | | |
| REF | 2 | | | | |
| WTW | 1 | 1 | 1 | | |
| XOB | 0.00000 | 0.00000 | 0.00000 | 0.00000 | 0.00000 |
| | 0.00000 | 0.00000 | | | |
| YOB | 0.00000 | 26.51700 | 40.00000 | 53.03300 | 64.95100 |
| | 70.15600 | 75.00000 | | | |
| WTF | 0.00000 | 0.00000 | 1.00000 | 1.00000 | 1.00000 |
| | 1.00000 | 1.00000 | | | |
| VUX | 0.00000 | −0.00138 | −0.00308 | −0.00534 | −0.00803 |
| | −0.00941 | −0.01082 | | | |
| VLX | 0.00000 | −0.00138 | −0.00308 | −0.00534 | −0.00803 |
| | −0.00941 | −0.01082 | | | |
| VUY | 0.00000 | −0.00065 | −0.00224 | −0.00398 | −0.00520 |
| | −0.00531 | −0.00535 | | | |
| VLY | 0.00000 | −0.00370 | −0.00706 | −0.01156 | −0.01709 |
| | −0.01985 | −0.02220 | | | |

APERTURE DATA/EDGE DEFINITIONS

CA
APERTURE data not specified for surface Obj thru 46

PRIVATE CATALOG

| | | | |
|---|---|---|---|
| PWL | 157.63 | 157.63 | 157.63 |
| 'CAF-UV' | 1.558411 | 1.558410 | 1.558409 |

REFRACTIVE INDICES

| | | | |
|---|---|---|---|
| GLASS CODE | 157.63 | 157.63 | 157.63 |
| 'CAF-UV' | 1.558409 | 1.558410 | 1.558411 |

No solves defined in system
No pickups defined in system

INFINITE CONJUGATES

| | |
|---|---|
| EFL | −66053.1391 |
| BFL | −16500.9052 |
| FFL | 0.2642E+06 |
| FNO | −0.0000 |

AT USED CONJUGATES

| | |
|---|---|
| RED | −0.2500 |
| FNO | 0.6667 |
| OBJ DIS | 34.0000 |
| TT | 1198.5356 |
| IMG DIS | 11.9990 |
| OAL | 1152.5365 |

PARAXIAL IMAGE

| | |
|---|---|
| HT | 18.7496 |
| THI | 12.0008 |
| ANG | 0.0000 |

ENTRANCE PUPIL

| | |
|---|---|
| DIA | 0.3818E+10 |
| THI | 0.1000E+11 |

EXIT PUPIL

| | |
|---|---|
| DIA | 25217.8299 |
| THI | −16501.3415 |

CODE V> out t

Key for Table 1:
(1) OBJ stands for object plane;
(2) IMG stands for image plane;
(3) RDY stands for radius;
(4) THI stand for thickness;
(5) RMD stands for reflective;

TABLE 1-continued

CODE V> lis
Shafer - design .75NA, 4x, 75 mm Obj. - hight

| RDY | THI | RMD | GLA | CCY | THC | GLC |
|-----|-----|-----|-----|-----|-----|-----|

(6) GLA stands for glass sort;
(7) CAF-UV stands for $Ca_2F$, ultraviolet grade;
(8) NAO stands for numerical aperture at object side;
(9) DIM stands for dimensions in millimeters;
(10) WL stands for wavelength; and
(11) REFRACTIVE INDICES gives the refractive index of $CaF_2$ taken as given quantity for the calculation.

Key for Table 1: (1) OBJ stands for object plane; (2) IMG stands for image plane; (3) RDY stands for radius; (4) THI stand for thickness; (5) RMD stands for reflective; (6) GLA stands for glass sort; (7) CAF-UV stands for $Ca_2F$, ultraviolet grade; (8) NAO stands for numerical aperture at object side; (9) DIM stands for dimensions in millimeters; (10) WL stands for wavelength; and (11) REFRACTIVE INDICES gives the refractive index of $CaF_2$ taken as given quantity for the calculation.

I claim:

1. A microlithographic reduction projection catadioptric objective having an image side and an object side and curved mirrors and being devoid of planar folding mirrors, comprising an aperture plane on the image side of a most imageward curved mirror and comprising 4 curved mirrors and more than 8 lenses.

2. The microlithographic reduction projection catadioptric objective according to claim 1, comprising no more than one optical element that is in a substantially non rotationally symmetric form.

3. The objective according to claim 1, comprising at least one spherical mirror.

4. The objective according to claim 1, comprising, in sequence from an object plane end, a first and a third curved mirror that are concave and a fourth mirror that is convex.

5. A microlithographic reduction projection catadioptric objective having a system that is free of central obscuration of an aperture, comprising a plurality of optical elements and having a straight axis of symmetry of all curvatures of all optical elements, wherein no more than two optical elements deviate substantially from disk form.

6. The microlithographic reduction projection catadioptric objective according to claim 5 having an object side and an image side, comprising, in sequence from the object side to the image side, a catadioptric group comprising one curved mirror and having a negative reduction ratio, a group comprising an odd number of curved mirrors and having a positive reduction ratio, and a dioptric lens group having a negative reduction ratio.

7. The objective according to claim 6, wherein the catadioptric group comprises a positive field lens group and a negative lens group next to the curved mirror, and the dioptric lens group comprises more positive than negative lenses.

8. The objective according to claim 5, wherein the optical elements comprise lenses that are all located within a cylindrical envelope of minimal radius, and curved mirrors, all but one of the curved mirrors being located within a same envelope.

9. Projection exposure apparatus comprising a projection objective according to claim 5, an excimer light source, an illumination system, a reticle handling, positioning and scanning system, and a wafer handling, positioning and scanning system.

10. The objective of claim 5, having an object side and an image side, wherein a most imageward mirror is convex.

11. A microlithographic reduction projection catadioptric objective having an object side and an image side and curved mirrors and being devoid of planar folding mirrors, comprising an aperture plane on the image side of a most imageward curved mirror, the objective consisting in sequence from the object side to the image side of a catadioptric group providing a real intermediate image, a catoptric or catadioptric group as a whole providing a virtual image, and a dioptric group providing a real image.

12. The objective according to claim 11, wherein the catadioptric group comprises a positive field lens group and a negative lens group next to a mirror, and wherein the dioptric lens group comprises more positive than negative lenses.

13. The objective according to claim 11, wherein the image side numerical aperture is NA=0.7 or greater, at an image field of 5 mm×20 mm to 8 mm×30 mm.

14. The objective according to claim 11, wherein all lenses built in as full disks do not obstruct a beam path.

15. The objective according to claim 11, comprising a field lens group next to an object plane and being object side telecentric.

16. Projection exposure apparatus comprising a projection objective according to claim 11, an excimer light source, an illumination system, a reticle handling, positioning and scanning system, and a wafer handling, positioning and scanning system.

17. The objective of claim 11, wherein a most imageward mirror is convex.

18. A microlithographic reduction projection catadioptric objective having an object side and an image side, comprising, in sequence from the object side to the image side, a catadioptric group comprising one curved mirror and having a negative reduction ratio, a group comprising an odd number of curved mirrors and having a positive reduction ratio, and a dioptric lens group having a negative reduction ratio, wherein at least two curved mirrors face one another and are free from any lenses being physically therebetween.

19. Projection exposure apparatus comprising a projection objective according to claim 18, an excimer light source, an illumination system, a reticle handling, positioning and scanning system, and a wafer handling, positioning and scanning system.

20. The objective of claim 18, wherein a most imageward mirror is convex.

21. A microlithographic reduction projection catadioptric objective, having an object side and an image side, comprising an even number greater than two of curved mirrors, with an unobscured system aperture and including more lenses than curved mirrors, being devoid of planar folding mirrors and comprising an aperture plane on the image side of a most imageward curved mirror.

22. The objective of claim 21, wherein the most imageward mirror is convex.

23. A microlithographic reduction projection catadioptric objective, comprising 4 curved mirrors and more than 8 lenses forming a system with an unobscured pupil, comprising a straight axis of symmetry of all curvatures of all optical elements, wherein no more than two optical elements deviate substantially from disk form.

24. The objective of claim 23, wherein no more than one optical element deviates substantially from disk form.

25. The objective of claim 23, having an object side and an image side, wherein a most imageward mirror is convex.

26. A microlithographic reduction projection catadioptric objective having an object side and an image side, comprising more than two curved mirrors and no more than one optical element that is in a substantially non rotationally symmetric form, consisting of, in sequence from the object side to the image side, a catadioptric group providing a real intermediate image, a catoptric or catadioptric group providing a virtual image, and a dioptric group providing a real image, wherein a most imageward mirror is convex.

27. An optical system comprising a microlithographic reduction projection catadioptric objective having an object side and an image side and a plurality of curved mirrors, wherein directly after a most imageward curved mirror the beam diverges, wherein the objective comprises, in sequence from the object side to the image side, a field lens group, a catadioptric group comprising one or more negative lenses and a concave mirror, generating axial chromatic aberration, a group comprising an odd number of mirrors, and a positive lens group.

28. The optical system according to claim 27, further including an excimer light source, an illumination system, a reticle handling, positioning and scanning system, and a wafer handling, positioning and scanning system.

29. A microlithographic reduction projection catadioptric having an image side and an object side and curved mirrors and being devoid of planar folding mirrors, comprising an aperture plane on the image side of a most imageward curved mirror, wherein the most imageward mirror is convex.

30. The objective according to claim 29, further comprising a straight axis of symmetry of all curvatures of all optical elements.

31. The objective according to claim 30, wherein the curved mirrors have optical surfaces that comprise sections or full surfaces of revolution.

32. Projection exposure apparatus comprising a projection objective according to claim 29, an excimer light source, an illumination system, a reticle handling, positioning and scanning system, and a wafer handling, positioning and scanning system.

33. A microlithographic reduction projection catadioptric objective having an object side and an image side, comprising more than two curved mirrors and no more than one optical element that is a cut off section of a body of revolution, consisting of, in sequence from the object side to the image side, a catadioptric group providing a real intermediate image, a catoptric or catadioptric group providing a virtual image, and a dioptric group providing a real image.

34. An optical system comprising a microlithographic reduction projection catadioptric objective having an object side and an image side and a plurality of curved mirrors, wherein directly after a most imageward curved mirror the beam diverges wherein the most imageward mirror is convex.

35. A microlithographic reduction projection catadioptric objective having an object side and an image side, comprising, in sequence from the object side to the image side, a field lens group, a catadioptric group comprising one or more negative lenses and a concave mirror, generating axial chromatic aberration, a group comprising an odd number of curved mirrors, and a positive lens group wherein a most imageward mirror is convex.

36. The objective according to claim 35, comprising an aperture plane located within a catadioptric chromatic aberration generating group comprising at least one negative lens and a concave mirror.

37. Projection exposure apparatus comprising a projection objective according to claim 35, an excimer light source, an illumination system, a reticle handling, positioning and scanning system, and a wafer handling, positioning and scanning system.

38. A microlithographic reduction projection catadioptric objective having an object side and an image side, comprising an even number greater than two of curved mirrors, with an unobscured system aperture and including more lenses than curved mirrors, wherein after a most imageward curved mirror the beam diverges and wherein the most imageward mirror is convex.

* * * * *

UNITED STATES PATENT AND TRADEMARK OFFICE
CERTIFICATE OF CORRECTION

PATENT NO. : 6,873,476 B2
DATED : March 29, 2005
INVENTOR(S) : David R. Shafer et al.

It is certified that error appears in the above-identified patent and that said Letters Patent is hereby corrected as shown below:

<u>Title page,</u>
Item [73], Assignee, please delete "Carl-Zeiss-Stiftung" and substitute with
-- Carl-Zeiss-Stiftung Trading as Carl-Zeiss --.

Signed and Sealed this

Nineteenth Day of July, 2005

JON W. DUDAS
*Director of the United States Patent and Trademark Office*